Aug. 17, 1965 J. D. VENABLES 3,201,665

SOLID STATE DEVICES CONSTRUCTED FROM SEMICONDUCTIVE WHISKERS

Filed Nov. 20, 1961

INVENTOR.
JOHN D. VENABLES

BY John R. Doherty

ATTORNEY 3,201,665

SOLID STATE DEVICES CONSTRUCTED FROM SEMICONDUCTIVE WHISKERS

John D. Venables, Parma, Ohio, assignor to Union Carbide Corporation, a corporation of New York Filed Nov. 20, 1961, Ser. No. 153,530
4 Claims. (Cl. 317—235)

This invention relates generally to solid state devices of a novel character which are capable of manufacture with less difficulty and at a relatively lower cost than devices of the prior art.

The invention has particular reference to field effect devices adapted for use in applications where the flow of electrical current in a circuit is to be controlled or modulated.

In recent years solid state devices have attracted considerable attention in the electronic industry. The attractiveness of these devices lies principally in such features as their small size, low power dissipation, ruggedness and dependability. Some of these devices, however, have proven to be difficult to manufacture and their costs are high.

For example, in the manufacture of field effect devices, difficulty has been encountered in the preparation of semiconductor materials for use in the fabrication of these devices. This difficulty has arisen principally from the necessity of having the control region of field effect devices comparable in size to the thickness of the barrier layer upon which these devices depend. The barrier layer thickness of field effect devices is fundamentally of an extremely small dimension being of the order in some instances of about twenty-five microns or less and has heretofore required the utilization of precise techniques for reduction in size of the semiconductor material. The semiconductor material has been prepared, for instance, by cutting or dicing large semiconductor boules to obtain smaller size wafers and then by grinding, etching or lapping the wafers to reduce their size. These precise techniques greatly increase the manufacturing costs of field effect devices and limit their potential use in many applications.

The invention thus has for its principal object to provide a solid state device, and in particular a field effect device, which can be manufactured with little difficulty and at a low cost.

Another object is to provide a field effect device of a versatile construction which can be readily fabricated and which is economical to manufacture.

The invention by means of which these objects are achieved is a solid state device having a semiconductor whisker as its operative element.

The term "whisker" as it is used herein and in the appended claims refers particularly to needle-like semiconductor materials which are conventionally produced by vapor or electrolytic deposition techniques known in the art. The technology of whiskers and methods for their production are described in detail in the literature, particular reference being made to the articles "Metal Whisker" by S. S. Brenner, Scientific American, vol. 203, 1960, and "Growth and Perfection of Crystals," part II, edited by Doremus, Roberts & Turnbull, John Wiley and Sons, Inc., New York, 1958.

More specifically, monocrystalline semiconductor whiskers are utilized in the practice of the invention. These monocrystalline whiskers can be produced of a diameter which is approximately the same size as the fundamentally small thickness of the barrier layer of a field effect device. The term "barrier layer" used herein is applied to a high resistance interfacial condition between contacting semiconductors or respectively opposite conductivity type, or between a semiconductor and a metallic conductor whereby current passes with relative ease in one direction and with relative difficulty in the other. The terms "n type" and "p type" are applied to semiconductive materials which tend to pass current easily when the metal is respectively negative or positive with respect to a conductive connection thereto and with difficulty when the reverse is true, and which also have consistent Hall and thermoelectric effects. Moreover, they appear to possess a smaller number of dislocations, vacancies and grain boundaries than most bulk type semiconductor materials and are generally possessed of a superior crystal structure. The requirements of the whisker are that it possess a relatively high carrier mobility, an electrical resistivity perferably within the range of between about 0.01 to 1000 ohm centimeters and that it be of a size generally within the range of between about 10 to 1000 microns in diameter. For field effect devices, the electrical resistivity should be between 10 and 100 ohm centimeters. The whiskers may be composed of any of a great number of semiconductor materials of the desired type conductivity, for example, doped and undoped germanium, silicon and silicon carbide, to mention only a few.

In the practice of the invention, solid state devices of the character herein described may be conveniently provided with alloy or diffused junctions by most any of the several techniques known in the art. For example, in a particular instance utilizing a monocrystalline n-type silicon whisker in the fabrication of a field effect device, an alloy rectifying junction of the p-n type may be conveniently made by evaporating a small quantity of dopant such as antimony, gallium or aluminum on the appropriate region of the whisker, followed by heat treating the whisker under controlled conditions to temperatures sufficiently high in order to effect diffusion or alloying formation of the junction. It will of course be appreciated that many other methods may be employed as will be apparent to those skilled in the art.

The invention is applicable to a great variety of solid state devices including the field effect device as already mentioned, transistors, diodes, transistor triodes and the like. It is however particularly adapted to the fabrication of the field effect device hereinafter to be referred to as a "whistor."

Figure 1:
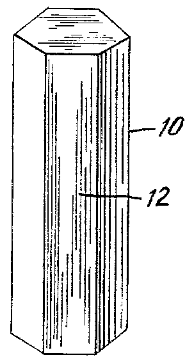
FIG. 1 is a greatly enlarged view in perspective of one form of monocrystalline semiconductor whisker useful in devices embodying the invention.

Referring now to the drawing, there is shown in FIG. 1 a greatly enlarged view of a monocrystalline semiconductor whisker 10 of a configuration particularly adapted to one type of device to be hereinafter described. The whisker 10 is generally hexagonal and has substantially rectangular surfaces as indicated at 12 in FIG. 1.

Figure 2:
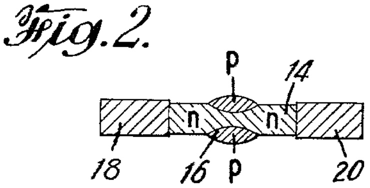
FIG. 2 is a vertical section of a field effect device of the invention.

A whistor of a construction embodying the invention is shown in FIG. 2. The whistor shown comprises a monocrystalline whisker 14 of n-type conductivity to which is provided a p-type rectifying contact 16 and a pair of ohmic contacts 18, 20, one of each of which is provided at each end of the whisker 14. In operation the whistor serves as a current control device, the junction formed by the rectifying contact 16 acting as a gate when properly biased for controlling the amount of electrical current passed between the ohmic contacts 18, 20.

Figure 3:
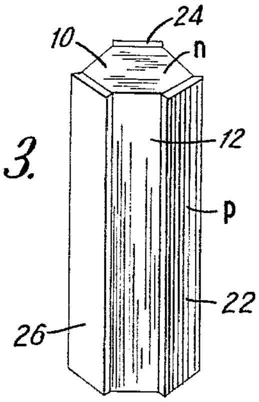
FIG. 3 is a view similar to FIG. 1 showing another device.

The whistor just described in characterized in that the flow of electrical current is longitudinal to the axis of the whisker 14. A construction for a whistor in which the flow of electrical current is transverse to the axis of the whisker is shown in FIG. 3. In this instance, the whistor comprises an n-type hexagonal whisker 10 of the configuration shown in FIG. 1 to one of whose rectangular surfaces 12 is made a p-type rectifying contact 22 and to other non-adjacent surfaces 12 of which are made ohmic contacts 24, 26. This arrangement for a whistor is suitable for use in applications particularly where a low output impedance is desired. The current to be modulated passes radially through the whisker 10 in a relatively short low impedance path between the ohmic contacts 24, 26. An advantage of this device is that higher power densities may be achieved than with whistors having a longitudinal configuration such as shown in FIG. 2.

Figure 4:
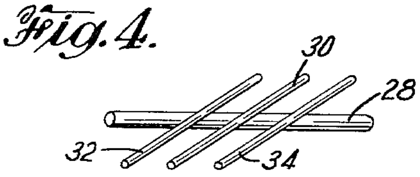
FIG. 4 is a similar view showing still another device.

Another construction for a whistor is shown in FIG. 4. The whistor here shown comprises a monocrystalline semiconductor whisker 28 to which is connected to form a rectifying contact a conductor 30. To each side of the conductor 30 ohmic contacts are similarly provided by conductors 32, 34. In the fabrication of this whistor, to form both rectifying and ohmic contacts, it is convenient to stretch the conductors 30, 32 and 34 across whisker 28 to weld them to it. This may be done, for example, by spot welding. The junctions should, of course, be made in a non-oxidizing atmosphere suitably of hydrogen, for instance.

A number of whistors embodying the invention have been made and tested. The whistors when subjected to test performed well and exhibited good electrical characteristics. For example, in one test, a whistor of the construction illustrated in FIG. 2 was made from a monocrystalline whisker of n-type silicon. The whisker had a diameter of about 30 microns, a length of about 800 microns and had an electrical resistivity of between 10 and 50 ohm-centimeters. To obtain ohmic and rectifying contacts, the entire surface of the whisker was first plated with nickel by depositing nickel carbonyl on the surface of the whisker at a temperature of about 95° C. Two segments of the plated whisker about 300 microns in length at each end were masked with polystyrene, leaving a segment of about 200 microns exposed at the center of the whisker. The nickel plating at this center segment of the whisker was etched away with an aqueous $HF-HNO_3$ etchant. A rectifying contact was then made to the bare silicon at the center segment by painting the whisker with conductive silver paint. The masking was then stripped with toluene from the two outer segments of the whisker, leaving the nickel plate exposed to serve as the ohmic contacts for the device.

Figure 5:
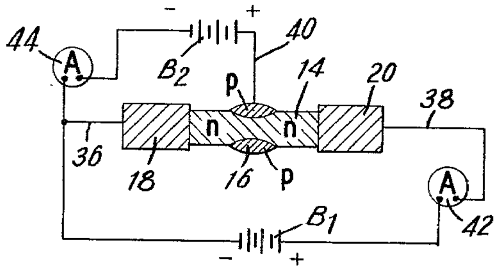
FIG. 5 is a diagrammatical view showing an electrical circuit utilizing the device of FIG. 2.

Referring to FIG. 5, the whistor was then connected across a current source provided by a battery $B_1$ by leads 36, 38, and was tested. The current from the battery $B_1$ was controlled by varying the bias voltage applied to the rectifying contact 16, this voltage being supplied by a battery $B_2$ connected to the rectifying contact 16 by a lead 40. The current was measured by a microammeter 42, and the current flowing in the biasing circuit was measured by a high sensitivity microammeter 44. In the test, the battery $B_1$ had a voltage of 30 volts and delivered a current of 60 microamperes. The bias battery $B_2$ also had a maximum voltage of 30 volts. The input impedance of the whistor was found to be between $10^8$ to $10^9$ ohms, the output impedance $7\times10^5$ ohms. The voltage gain was $\frac{1}{20}$, and the current gain was $10^3$. The frequency response was estimated to be of the order of 10 megacycles per second.

In another test, a whistor of a similar construction was made from an n-type silicon whisker having a diameter of 40 microns, and was tested. The whistor was fabricated in identically the same manner as for the device previously described. The whistor after it was tested was found to possess an input impedance of $10^8$ ohms, an output impedance of $5\times10^6$ ohms and had a voltage gain of ¼ and a current gain of $10^2$.

It will be seen from the above data that a whistor of the construction tested is suited for use in applications where a high input impedance is needed to control a current in a low impedance output circuit. In other instances where a lower output impedance is required, a whistor of the construction shown in FIG. 3 would be recommended.

Figure 6:
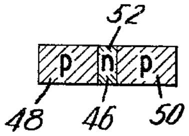
FIGS. 6, 7, 8 and 9 are schematic views of a number of devices embodying the invention.

While the invention has been described with particular reference to a field effect device herein referred to as a whistor, it will be understood that invention is not to limited and is applicable to great variety of solid state devices. For instance, referring to FIG. 6, a transistor is shown which is made from an n-type monocrystalline whisker 46 having p-type regions 48, 50 at both of its ends, these serving as the emitter and collector. In the fabrication of this device, the p-type regions 48, 50 are suitably obtained by diffusing an acceptor material into both ends of the whisker 46, leaving a narrow base region 52 of n-type conductivity at the center.

Figure 7:
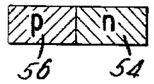

In FIG. 7 a p-n junction diode is shown. The diode is made from an n-type monocrystalline whisker 54 provided with a p-type region 56, this region also being obtained by diffusing an acceptor material into one end of the whisker 54.

Figure 8:
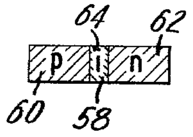

FIG. 8 shows a p-i-n diode. In the fabrication of this diode, a whisker 58 of intrinsic material is utilized. A p-type region 60 is provided at one end of the whisker 58, and at its other end is provided an n-type region 62. In a similar manner, these regions are obtained by diffusing a donor and an acceptor material into each end of the whisker 58, leaving an intrinsic region 64 at the center.

Figure 9:
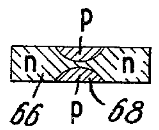

In FIG. 9 a double base diode is shown. This diode is characterized in that a p-n junction is provided which is axially oriented in the whisker. The diode shown is made from an n-type monocrystalline whisker 66 having a circumferentially disposed p-type region 68, this region being obtained by diffusing or alloying an acceptor material radially into the centermost portion of the whisker 66.

In one example a diode of the construction of FIG. 7 was made from a monocrystalline n-type silicon whisker having a diameter of approximately 0.2 millimeter. The silicon whisker was provided with two contacts made with gold and silver paste, respectively. In the former instance, the gold paste was baked at 700° C. for five minutes, and in the latter, the silver paste was baked at 60° C. for 1½ hours. The diode was tested and found to possess a forward resistance of 30,000 ohms, a back resistance of 3 megohms and had a rectification ratio of 100 to 1 approximately.

The several different types of solid state devices described herein are merely illustrative to the great variety which can be made by utilizing the principles of the invention. In addition to the two and three electrode devices shown, the invention is applicable equally as well to tetrodes and other multi-electrode devices. Photo radiation counters and a host of many other devices will readily occur to those skilled in the art.

I claim:

1. A semiconductor device comprising: a whisker of semiconductor material of one conductivity type, said whisker having a diameter in the range of about 10 microns to about 1000 microns, a hexagonal cross section and six longitudinal faces; a region of opposite conductivity type covering substantially the entire surface of one of said longitudinal faces and forming a rectifying contact therewith; and two ohmic contacts, one on each of the other non-adjacent longitudinal faces and each ohmic contact covering substantially the entire surface of each said face.

2. A semiconductor device comprising: a whisker of monocrystalline semiconductor material of one conductivity type, said whisker having a diameter in the range of about 10 microns to about 1000 microns, a hexagonal cross section and six substantially rectangular longitudinal faces; a region of opposite conductivity type covering substantially the entire surface of one of said longitudinal faces and forming a rectifying contact therewith; and two ohmic contacts, one on each of the other nonadjacent longitudinal faces and each ohmic contact covering substantially the entire surface of each said face.

3. A device as defined by claim 2 in which said whisker has an electrical resistivity of between about 0.01 to 1000 ohm centimeters.

4. A device as defined by claim 2 in which said whisker is composed of a semiconductor material selected from the group of germanium, silicon and silicon carbide.

References Cited by the Examiner

UNITED STATES PATENTS

| | | | |
|---|---|---|---|
| 2,502,479 | 4/50 | Pearson et al. | 317—235 |
| 2,600,500 | 6/52 | Haynes et al. | 317—235 X |
| 2,649,574 | 8/53 | Mason | 317—234 |
| 2,683,676 | 7/54 | Little et al. | 317—235 |
| 2,836,797 | 5/58 | Ozarow | 317—235 X |
| 2,854,364 | 9/58 | Lely | 148—1.5 |
| 2,860,291 | 11/58 | Karnas | 317—235 |
| 2,922,934 | 1/60 | Hall | 317—235 |
| 2,932,748 | 4/60 | Johnson | 317—235 |
| 2,948,836 | 8/60 | Freedman | 317—235 |
| 2,958,022 | 10/60 | Pell | 317—235 |
| 2,996,800 | 8/61 | Holly | 317—240 X |
| 3,007,090 | 10/61 | Rutz | 317—235 |
| 3,021,459 | 2/62 | Grubbs et al. | 317—234 |
| 3,025,192 | 3/62 | Lowe | 148—33 |
| 3,025,342 | 3/62 | Volberg | 317—234 |
| 3,031,403 | 4/62 | Bennett | 317—235 X |
| 3,093,520 | 6/63 | John et al. | 317—235 X |

OTHER REFERENCES

"Tensile Strength of Whiskers" by S. S. Brenner, found in the "Journal of Applied Physics," volume 27, Number 12, December 1956, page 1484.

DAVID J. GALVIN, *Primary Examiner.*

JAMES D. KALLAM, *Examiner.*